US011158595B2

(12) United States Patent
Kim et al.

(10) Patent No.: US 11,158,595 B2
(45) Date of Patent: Oct. 26, 2021

(54) EMBEDDED DIE PACKAGE MULTICHIP MODULE

(71) Applicant: TEXAS INSTRUMENTS INCORPORATED, Dallas, TX (US)

(72) Inventors: Woochan Kim, Sunnyvale, CA (US); Masamitsu Matsuura, Oita (JP); Mutsumi Masumoto, Oita (JP); Kengo Aoya, Oita (JP); Hau Thanh Nguyen, San Jose, CA (US); Vivek Kishorechand Arora, San Jose, CA (US); Anindya Poddar, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/028,741

(22) Filed: Jul. 6, 2018

(65) Prior Publication Data
US 2019/0013288 A1    Jan. 10, 2019

Related U.S. Application Data

(60) Provisional application No. 62/529,558, filed on Jul. 7, 2017.

(51) Int. Cl.
*H01L 23/48* (2006.01)
*H01L 23/00* (2006.01)
(Continued)

(52) U.S. Cl.
CPC ............ *H01L 24/24* (2013.01); *H01L 21/565* (2013.01); *H01L 23/295* (2013.01); *H01L 23/3107* (2013.01); *H01L 23/3121* (2013.01); *H01L 23/4334* (2013.01); *H01L 23/528* (2013.01); *H01L 23/5226* (2013.01); *H01L 23/5389* (2013.01); *H01L 23/53228* (2013.01); *H01L 23/53242* (2013.01); *H01L 24/05* (2013.01);
(Continued)

(58) Field of Classification Search
CPC ............ H01L 23/3107; H01L 23/3121; H01L 23/5226; H01L 23/5389
USPC ......................................................... 257/723
See application file for complete search history.

(56) References Cited

U.S. PATENT DOCUMENTS

| | | | | | |
|---|---|---|---|---|---|
| 4,060,828 | A | * | 11/1977 | Satonaka | ............... H01L 21/312 257/774 |
| 5,656,863 | A | * | 8/1997 | Yasunaga | ............... H01L 21/565 257/778 |

(Continued)

OTHER PUBLICATIONS

International Search Report for PCT/US 2018/041304 dated Oct. 4, 2018.

*Primary Examiner* — Nitin Parekh
(74) *Attorney, Agent, or Firm* — Dawn Jos; Charles A. Brill; Frank D. Cimino

(57) ABSTRACT

An embedded die package includes a first die having an operating voltage between a first voltage potential and a second voltage potential that is less than the first voltage potential. A via, including a conductive material, is electrically connected to a bond pad on a surface of the first die, the via including at least one extension perpendicular to a plane along a length of the via. A redistribution layer (RDL) is electrically connected to the via, at an angle with respect to the via defining a space between the surface and a surface of the RDL. A build-up material is in the space.

13 Claims, 7 Drawing Sheets

(51) Int. Cl.
  *H01L 25/065* (2006.01)
  *H01L 23/532* (2006.01)
  *H01L 21/56* (2006.01)
  *H01L 23/31* (2006.01)
  *H01L 25/00* (2006.01)
  *H01L 23/29* (2006.01)
  *H01L 23/528* (2006.01)
  *H01L 23/522* (2006.01)
  *H01L 23/538* (2006.01)
  *H01L 23/433* (2006.01)
  *H01L 23/367* (2006.01)

(52) U.S. Cl.
  CPC .............. *H01L 24/19* (2013.01); *H01L 24/25* (2013.01); *H01L 24/82* (2013.01); *H01L 24/96* (2013.01); *H01L 25/0655* (2013.01); *H01L 25/50* (2013.01); *H01L 23/367* (2013.01); *H01L 23/3675* (2013.01); *H01L 23/3677* (2013.01); *H01L 2224/0231* (2013.01); *H01L 2224/0239* (2013.01); *H01L 2224/02371* (2013.01); *H01L 2224/04105* (2013.01); *H01L 2224/215* (2013.01); *H01L 2224/24137* (2013.01); *H01L 2224/2518* (2013.01); *H01L 2224/821* (2013.01)

(56) References Cited

U.S. PATENT DOCUMENTS

| | | | | |
|---|---|---|---|---|
| 6,329,608 | B1* | 12/2001 | Rinne | H01L 24/11 |
| | | | | 174/261 |
| 7,276,799 | B2* | 10/2007 | Lee | H01L 24/82 |
| 7,825,520 | B1* | 11/2010 | Longo | H01L 25/0657 |
| 7,859,085 | B2* | 12/2010 | Pagaila | H01L 21/6835 |
| | | | | 257/621 |
| 8,203,203 | B1 | 6/2012 | Scanlan | |
| 9,543,242 | B1* | 1/2017 | Kelly | H01L 23/49816 |
| 9,548,279 | B2* | 1/2017 | Iida | H01P 5/028 |
| 9,735,131 | B2* | 8/2017 | Su | H01L 25/0657 |
| 9,735,134 | B2* | 8/2017 | Chen | H01L 21/76804 |
| 9,984,992 | B2* | 5/2018 | DeLaCruz | H01L 24/49 |
| 2008/0136002 | A1 | 6/2008 | Yang | |
| 2010/0224992 | A1 | 9/2010 | MConnelee et al. | |
| 2014/0369084 | A1* | 12/2014 | Freeman | H02M 3/33523 |
| | | | | 363/21.03 |
| 2015/0036389 | A1* | 2/2015 | Freeman | H02M 1/10 |
| | | | | 363/16 |
| 2016/0276248 | A1 | 9/2016 | Huang et al. | |

* cited by examiner

EMBEDDED DIE PACKAGE MULTICHIP MODULE

CROSS REFERENCE TO RELATED APPLICATIONS

This application claims the benefit of U.S. Provisional Patent Application 62/529,558 filed on 7 Jul. 2017, and entitled EMBEDDED PACKAGE DESIGN FOR HIGH VOLTAGE, MULTICHIP MODULE, the entirety of which is incorporated by reference herein.

TECHNICAL FIELD

This disclosure relates to generally to semiconductor devices, and more specifically to an embedded die package multi-chip module.

BACKGROUND

Semiconductor packaging typically uses wirebonding to provide electrical connections. One semiconductor die is electrically connected to a conductive pattern which is used to route signals from the semiconductor die through to the rest of the package. Semiconductor packaging typically also uses a leadframe. The leadframe allows for the stacking of a second die package such as a land grid array (LGA) or leadframe package on top of the package. After both the semiconductor die and leadframe have been assembled in the package and electrically connected to a conductive pattern, a mold is used to cover or encapsulate the semiconductor die, wirebonding material, and the leadframe.

SUMMARY

This disclosure relates to an embedded multi-chip module. In one example, an embedded die package includes a first die having an operating voltage between a first voltage potential and a second voltage potential that is less than the first voltage potential. A via, including a conductive material, is electrically connected to a bond pad on a surface of the first die, the via including at least one extension perpendicular to a plane along a length of the via. A redistribution layer (RDL) is electrically connected to the via, at an angle with respect to the via defining a space between the surface and a surface of the RDL. A build-up material is in the space.

In another example, a method includes inserting a first die into an embedded die package. The first die has an operating voltage between a first voltage potential and a second voltage potential that is less than the first voltage potential. The method includes fabricating a via, including a conductive material, to a bond pad on a surface of the first die, the via including at least one extension perpendicular to a plane along a length of the via. The method includes fabricating a redistribution layer (RDL) electrically connected to the via, at an angle with respect to the via defining a space between the surface and a surface of the RDL. The method includes filling the space with a build-up material.

In yet another example, an embedded die package includes a die having an operating voltage between a first voltage potential and a second voltage potential that is less than the first voltage potential. A first via, including a conductive material, is electrically connected to a bond pad on a surface of the die, the via including at least one extension perpendicular to a plane along a length of the via. A first redistribution layer (RDL) is electrically connected to the via, at an angle with respect to the first via defining a first space between the surface and a surface of the first RDL. A second via, including a conductive material, is electrically connected to the first RDL, the second via including at least one extension perpendicular to a plane along a length of the second via. A second redistribution layer (RDL) is electrically connected to the second via, at an angle with respect to the second via defining a second space between the surface and the surface of the second RDL. A build-up material fills the first and second spaces defined by the first and the second vias.

DETAILED DESCRIPTION

Figure 1:
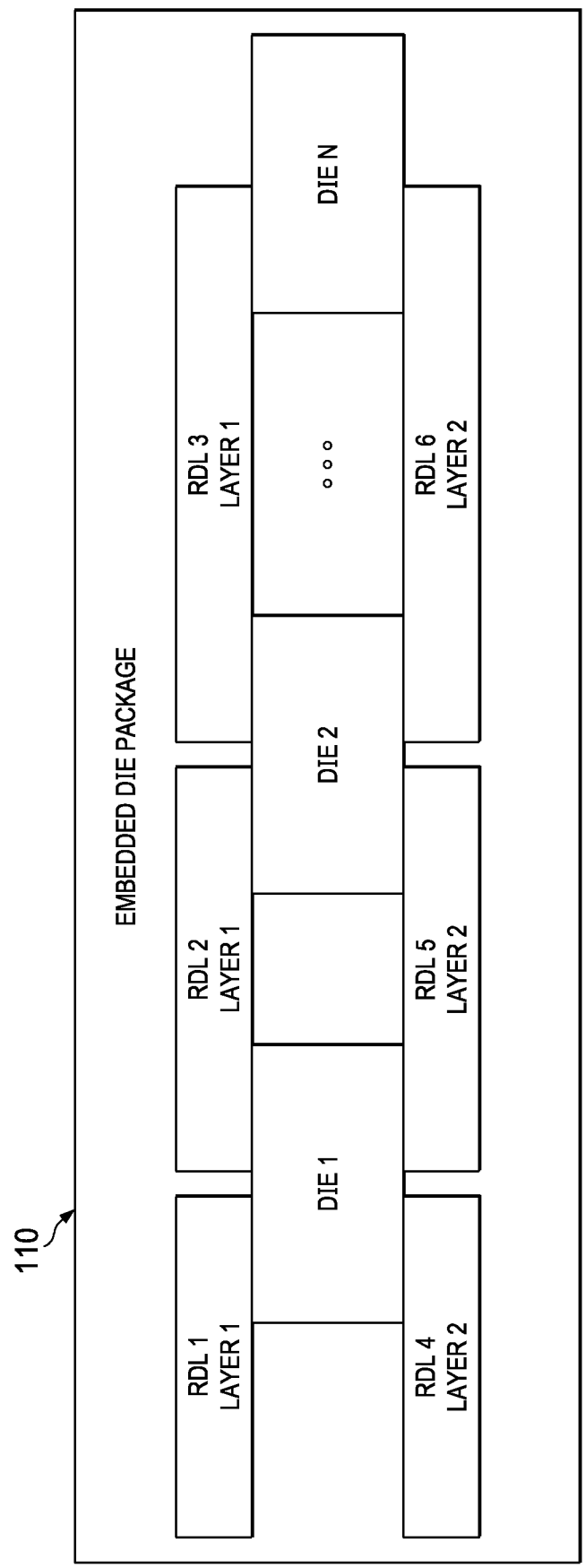
FIG. 1 is a block diagram of an example of an embedded die package with multiple embedded dies.

This disclosure relates to an embedded multi-chip module. The disclosed examples provide an embedded die package that includes an opening to house a semiconductor circuit. The semiconductor circuit includes multiple dies that are placed through the opening and mounted on the embedded die package. The dies are coupled within the embedded die package to collectively form the semiconductor circuit. By including multiple dies within the embedded die package, parasitic inductance can be mitigated since wire bonding between separate integrated circuit packages as in current designs is not employed in the examples described herein. In some examples, at least one of the dies can be a driver semiconductor device that provides control signals to a power switching device, where the driver device operates at a lower voltage potential than the power switching device. The embedded die package can be a composite fiber material, for example, that includes a polymer matrix.

In contrast to the examples described herein, current packaging designs incorporate one chip per package which necessitates wire bonding between packages and increases parasitic inductance. For instance, providing high power and high current in current designs often involves a driver/controller integrated circuit (IC), and that can be in a different package as a standalone device. The die and the driver IC may cooperate together on a printed circuit board (PCB) but as they do, they create a noise loop when the die switches on and off. Oftentimes, that can be significant enough to cause the packaging material to fail. To mitigate these problems, if two dies are fabricated concurrently in one package as described herein, very small sized interconnections can be made to suppress or minimize the noise loop, and thus, the die acting as a switch, for example, can switch on and off while mitigating switching noise. In some examples, one or more of the dies can be of higher voltage potential from one or more other of the dies. The high voltage dies can be spaced from potential arcing regions in the embedded die package using one or more vias and redistribution layers which can also be further stacked to further increase the spacing, if desired.

In some examples, the embedded die package includes a first redistribution layer (RDL), a second RDL (or more) to provide interconnections between the dies. The RDL redistributes a path signal from one point to another point of the embedded die package. A vertical interconnect access (VIA) can be fabricated between the plurality of dies and the first or second RDL to provide a stacking of the RDL to increase an electric field potential between one of the dies and one of the first or second RDL. The gap between the die and the RDL can be adjusted to sustain a desired voltage level. Moreover, in some examples, a post can be inserted through the opening of the embedded die package and placed alongside the respective dies. The post can be of any electrically conductive material, such as copper, aluminum, silver, gold, and so forth. The post provides a connection between a first RDL coupled to one side of the respective dies and a second RDL coupled to another side of the respective dies. The post mitigates the use of a plating process to connect RDL layers during manufacturing of the embedded die package. Plating adds stress to the packaging material, and thus, using the inserted post reduces the stress on the packaging material that the plating process would otherwise provide.

FIG. 1 is an example embedded die package 110 with multiple embedded dies shown as DIE 1, DIE2, through DIE N, where N is a positive integer. The embedded die package 110 includes an opening (see e.g., FIG. 6) to house a semiconductor circuit. As used herein, the term embedded die package refers to a material that is employed to house the respective dies 1-N, where the dies are fabricated separately from the embedded die packages and placed within the embedded die package such as via a pick and place machine. For example, the embedded die package 110 can be a composite fiber material that includes a polymer matrix. An example of such material includes pre-preg which is "pre-impregnated" composite fibers where a thermoset polymer matrix material, such as epoxy, can be employed. The fibers can be of the form of a weave and the matrix, for example, and bonded together and to other components during manufacture.

As used herein, the term "circuit" can include a collection of active and/or passive elements that perform a circuit function, such as an analog circuit or control circuit. Additionally or alternatively, for example, the term "circuit" can include an integrated circuit (IC) where all or some of the circuit elements are fabricated on a common substrate (e.g., semiconductor substrate, such as a die or chip). The dies 1-N are placed through the opening and mounted on the embedded die package 110. The 1-N dies can be coupled within the embedded die package 110 to collectively form the semiconductor circuit.

At least one of the plurality of dies 1-N can be a high voltage die having a higher substrate voltage potential than at least one other of the plurality of dies that operates at a lower voltage potential. For example, the high voltage die can be in a range having a first voltage potential of about 50 volts to a second voltage potential of about 600 volts. The lower voltage die can be below either of the first and second voltage potentials and operate at a loci level such as 5 volts for example. The dies 1-N can be grown on a substrate and then separated from the growing area of a semiconductor wafer before being placed into the embedded die package 110. For example, at least one of plurality of dies 1-N can be a driver semiconductor device, for example, to provide control signals to a power switching device (not shown), where the driver device can operate at a lower voltage potential than the power switching device operating at the higher voltage potential.

A first redistribution layer (RDL) shown as layer 1 includes structures RDL 1 through RDL 3 can be employed to provide electrical circuit coupling between the plurality of dies 1-N. A second RDL shown as RDL 3 through 6 of layer 2 can similarly be fabricated to provide connections between the dies. As used herein, the term redistribution layer (RDL) refers to a planar layer that is fabricated in a coplanar manner to the respective dies and to provide circuit connections between the respective dies. This is in contrast to current systems that may utilize wire bonding to connect the respective dies. The RDL structures of the first layer and second layer can be any conductive material such as copper, gold, silver, aluminum, and so forth. In this example, three RDL structures for layer 1 and three structures for layer 2 are shown but more or less than three structures per layer can be fabricated. In some examples, a single RDL can connect between multiple dies and in other examples, a separate RDL may be employed to provide a connection between at least two of the dies 1-N.

Figure 2:
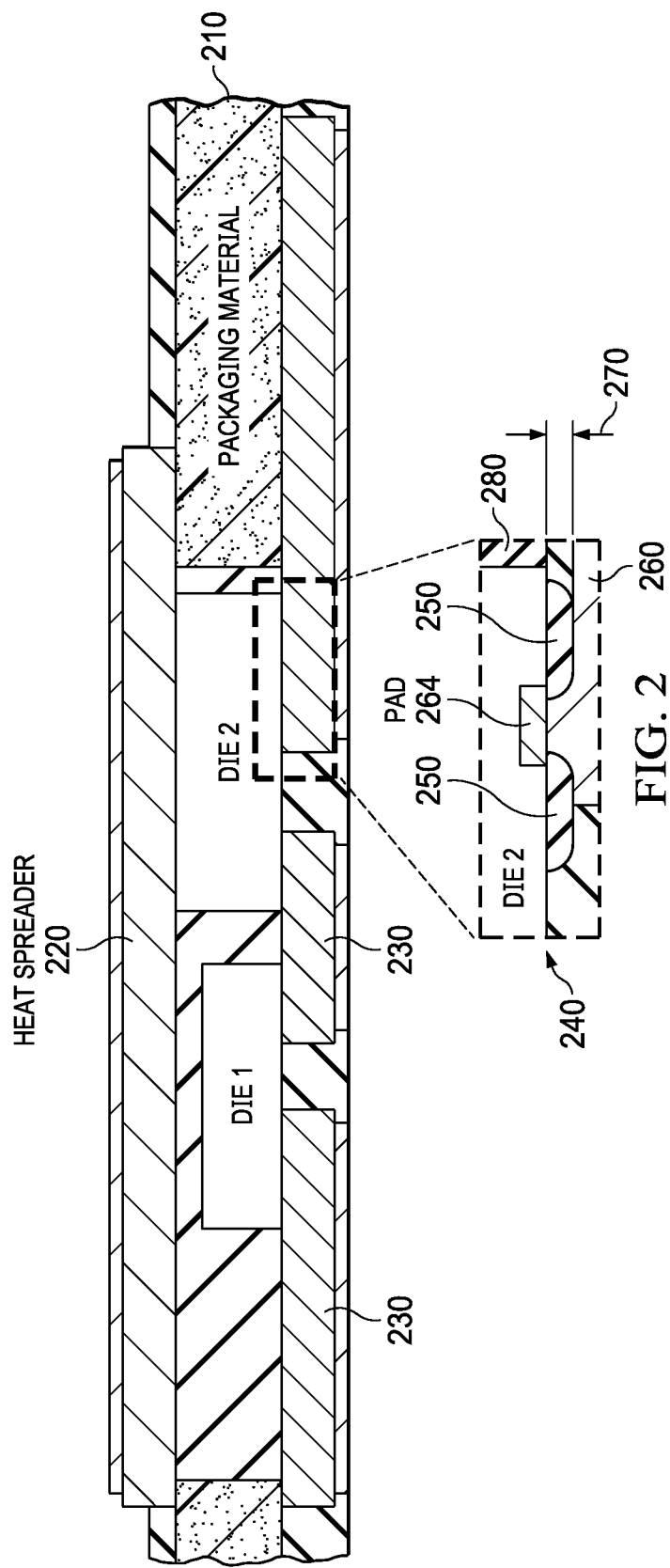
FIG. 2 is an illustration of an example implementation of the example embedded die package of FIG. 1.

FIG. 2 is an example embedded die package that depicts an implementation of the example apparatus of FIG. 1. In this example, two dies DIE 1 and DIE 2 are shown inserted into an embedded die package 210 however as described previously with respect to FIG. 1, more than two dies can be inserted. In this example, a heat spreader 220 (e.g., heat sink material) can be fabricated as a separate plane over one or more of the respective dies to remove heat from the dies. A fan-out layer, which can include a redistribution layer (RDL), is shown as layer portions 230 that connect from the die pad of the respective dies to a package footprint which connects the dies to other circuits. A cut-out section is shown at 240 which represents an expanded view of a portion of Die 2. The cut-out section 240 depicts a detailed structure at the edge of Die 2. In this cut-out section 240, each of the dies includes a passivation layer 250 that provides a separation between the respective dies and an RDL 260.

As used herein, the term passivation layer refers an oxide, nitride, and/or polyimide layer on the surface of a semiconductor to provide electrical stability by isolating the semiconductor surface from electrical and chemical conditions in the environment. For instance, this reduces reverse-current leakage, increases breakdown voltage, and raises power dissipation rating. A pad 264 can be provided which spans between the passivation layer 250 and provides a connection to the RDL 260. An arrow at 270 shows a distance between the edge of Die 2 and the RDL 260. In some examples, if RDL 260 were implemented as a high voltage RDL, then the distance 270 can be increased. The example illustrated and described below with respect to FIG. 3 describes a stacked RDL structure using VIAs that increases this distance and provides an increased isolation between the respective die edge and the RDL. A build-up material (e.g., insulator/resin material 280) can be fabricated to fill space around the die edges, between passivation layer 250, and to fill the gap at 270. As used herein, the term build-up material refers to a dielectric material to increase a space between the high voltage dies described herein and one or more RDL layers described herein. Such build-up material can be selected from a group consisting of: resin epoxy, silica build-up, and hardener, for example. By increasing the space and using the build-up material to fill the space, arcing between the high voltage die and one or more of the respective RDL can be mitigated.

Figure 3:
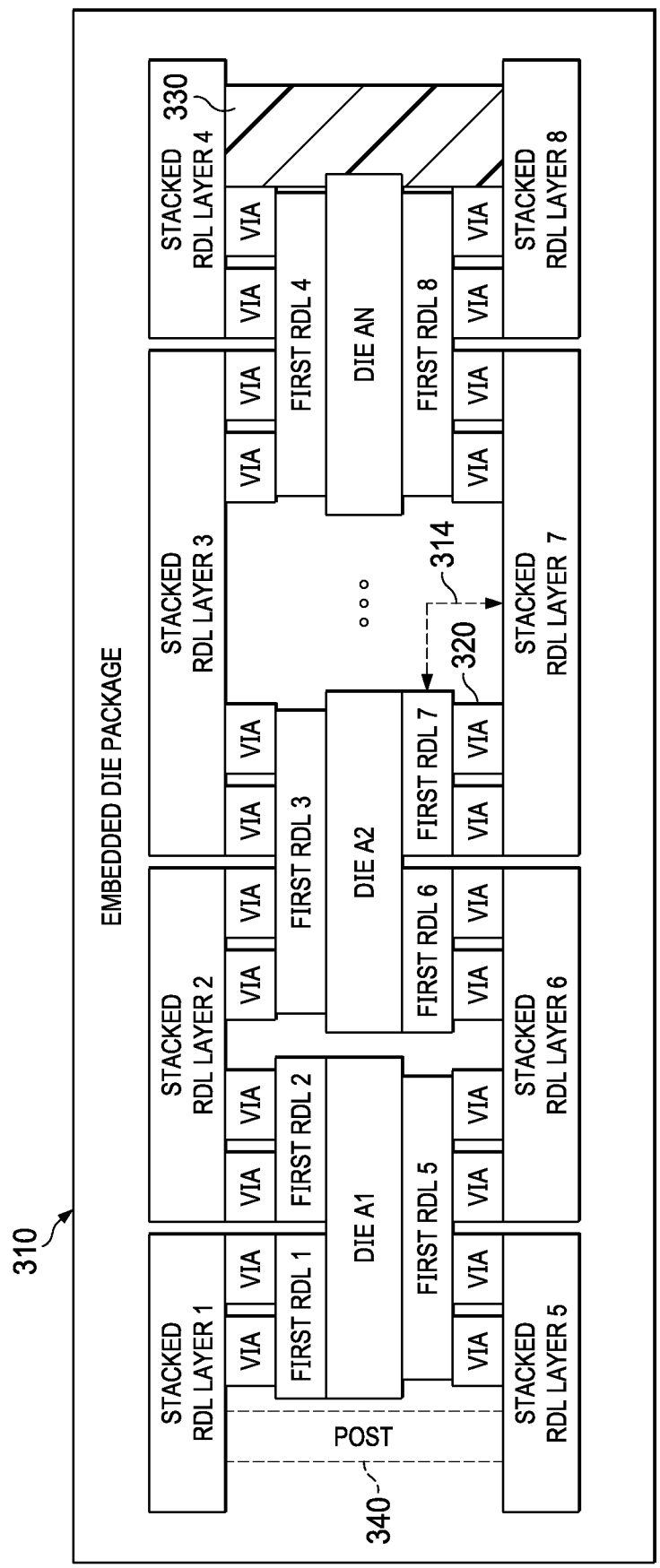
FIG. 3 is a block diagram of an example embedded die package with multiple embedded dies where a stacked redistribution layer structure provides additional isolation for the embedded dies.

FIG. 3 is an example apparatus 300 having an embedded die package with multiple embedded dies where a stacked redistribution layer structure provides additional isolation for the embedded dies. Similar to the apparatus 100 of FIG. 1, the apparatus 300 includes an embedded die package 310 that includes a plurality of inserted dies shown as DIE A1, DIE A2, and DIE AN, where N is a positive integer. In this example, eight stacked RDL layers are shown as stacked RDL layer 1 through 8 that are fabricated as layers of RDL material to increase a separation space 314 between the edge of the die and the stacked RDL. More or less than eight stacked RDL can be provided than shown in this example. Thus, the stacked RDL can provide at least a second RDL that is fabricated over a first RDL such as shown as first RDL layers 1-8 to provide a separation space 314 between the edge of DIE A2, for example, and high voltage RDL (stacked RDL layer 7).

In this example, a vertical interconnection access (VIA) such as shown at 320 is fabricated between the first RDL 7 and the second or stacked RDL 7 to provide a connection between the respective dies and the second RDL. A build-up material 330 can be fabricated between the high voltage die (e.g., DIE 2) and the RDL layers with VIA 320 in between. The build-up material 330 has a dielectric property to sustain high electric fields between the high voltage die such as DIE 2 and the second RDL which is provided by the respective VIAs. The build-up material can be, for example, laminate material that includes epoxy resin, silica filler, and hardener.

A post 340 (made of, for example, copper, aluminum, silver gold, and so forth) can be inserted through an opening of the embedded die package 310. The post 340 can be employed to provide a connection between a first RDL coupled to one side of the respective dies and a second RDL coupled to another side of the respective dies. For example, the post 340 can connect at least two of the plurality of dies via the first and second RDL in one example and/or provides electrical connection between the first and second RDL (or stacked RDL) to the RDL Layer 1 to 4 on the other side of the die in other examples. By fabricating the post 340 separately and inserting it into the embedded die package 310 along with the respective dies, this mitigates the use of an expensive and time-consuming plating process to fabricate the post and to connect RDL layers, heat spreader layers, and so forth during manufacturing of the embedded die package. Also, plating processes add stress to the embedded die package 310 and thus, using the inserted post 340 reduces the stress on the packaging material that the plating process would otherwise provide.

Figure 4:
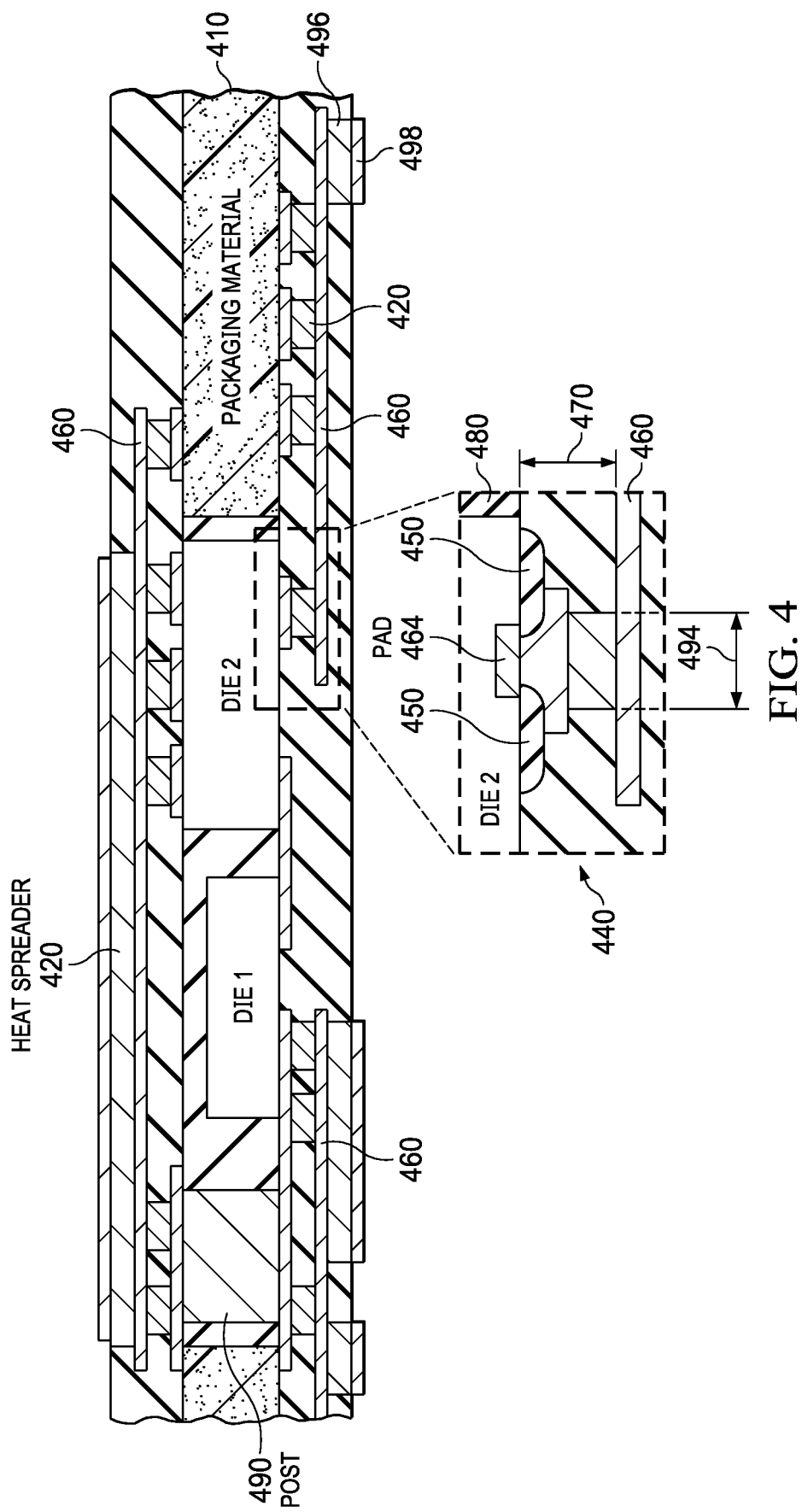
FIG. 4 is an illustration of an example implementation of the example embedded die package of FIG. 3.

FIG. 4 is an example implementation 400 of the example embedded die package of FIG. 3. In this example, two dies Die 1 and Die 2 are shown inserted into an embedded die package 410 however as described previously with respect to FIG. 3, more than two dies can be inserted. In this example, a heat spreader 420 (e.g., heat sink material) can be fabricated as a separate plane over one or more of the respective dies to remove heat from the dies. A fan-out layer, which can include a stacked redistribution layer (RDL) 460, is shown as layer portions that connect from the die pad of the respective dies to a package footprint which connects the dies to other circuits. A cut-out section is shown at 440 which represents an expanded view of a portion of Die 2. The cut-out section 440 depicts a detailed structure at the edge of Die 2. In this cut-out section 440, each of the dies include a passivation layer 450 that provides a separation between the respective dies and a stacked RDL 460.

A pad opening 464 can be provided which spans between the passivation layer 450 and provides a connection to the stacked RDL 460. An arrow at 470 shows a separation space between the edge of Die 2 and the stacked RDL 460. In some examples, if Die 2 were a high voltage die, then the separation space 470 can be increased. The stacked RDL 460 structure increases the separation space 470 and provides an increased isolation between the respective die edge and the stacked RDL 460. Moreover, the stacked RDL 460 can be fabricated as layers of RDL material to increase the separation space 470 between the edge of the die and the stacked RDL 460. A build-up material (e.g., insulator material) 480 can be fabricated to fill space around the die edges, between passivation layer 450, and to fill the gap at 470. The stacked RDL 460 shown in FIG. 4 can provide at least a second RDL that is fabricated over a first RDL to provide a separation distance 470 between a high voltage die, for example, and the first RDL.

In the example shown in FIG. 4, stacked RDL 460 is fabricated on top of a vertical interconnect access (VIA) such as shown at 420 for example over the second or stacked RDL in this example to provide a connection between the respective dies and the second RDL. The build-up material 480 can be fabricated between the high voltage die (e.g., Die 2) and the RDL layers with VIA 420 in between. The build-up material 480 has a dielectric property to sustain high electric field between the high voltage die such as Die 2 and the second RDL which is provided by the respective VIAs. The build-up material 480 can be, for example, an encapsulation material, epoxy resin, or a laminate material.

A post 490 (made of, for example, copper, aluminum, silver gold, etc.) can be inserted through an opening of the embedded die package 410. As mentioned previously, the post 490 can be employed to provide a connection between a first RDL coupled to one side of the respective dies and a second RDL coupled to another side of the respective dies. For example, the post 490 can connect at least two of the plurality of dies via the first and second RDL in one example and/or provides an electrical connection between the first and second RDL to the other side of die such as heat spreader 420 in other examples.

Figure 12:
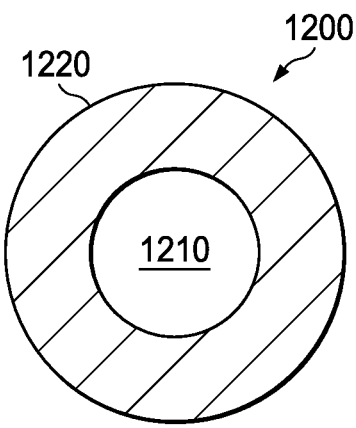
FIG. 12 illustrates a top view of an example VIA.

In one example, the embedded die package 410 includes a first die having an operating voltage between a first voltage potential and a second voltage potential that is less than the first voltage potential. A via such as shown at 420, including a conductive material, is electrically connected to the bond pad 464 on a surface of the first die, the via including at least one extension perpendicular to a plane along a length of the via. The extension is shown between reference lines 494. A top view of the via and extension is shown in FIG. 12. The redistribution layer (RDL) is electrically connected to the via, at an angle with respect to the via defining the space 470 between the surface and a surface of the RDL. The build-up material 480 is in the space as shown. An end of the RDL can be aligned with an end of the extension.

The build-up material 480 in the space 470 mitigates arcing between the first die and the RDL. A second die such as DIE 2 can have an operating voltage at a third voltage potential that is less than the second voltage potential. The first voltage potential is about 200 volts and the second voltage potential is about 50 volts, and the third voltage potential is about 5 volts, for example. In some examples, the build-up material 480 covers portions of the first die, the second die, the via, and the RDL. The length of the via 420 (or other vias) can between about 20 and 100 micro meters, where the space 470 is about the length of the via. The via conductive material is copper or gold, for example.

In yet another example, the via includes at least four extensions perpendicular to the plane along the length of the via. Thus, a stacked structure can be provided to increase the space 470 using stacked vias and RDL. In such stacked example, a die such as DIE 2 can have an operating voltage between a first voltage potential and a second voltage potential that is less than the first voltage potential. A first via such as via 420, includes a conductive material, is electrically connected to a bond pad on a surface of the die DIE 2, the via including at least one extension perpendicular to a plane along a length of the via such as shown at 494. A first redistribution layer (RDL) is electrically connected to the via, at an angle with respect to the first via defining a first space between the surface and a surface of the first RDL. A second via such as shown at 496, including a conductive material, is electrically connected to the first RDL, the second via including at least one extension perpendicular to a plane along a length of the second via. A second redistribution layer (RDL) such as shown at 498 is electrically connected to the second via, at an angle with respect to the second via defining a second space between the surface and the surface of the second RDL. The build-up material 470 fills the first and second spaces defined by the first and the second vias. Additional vias and RDL can be similarly stacked to increase the space 470 which can be filled with the build-up material 480 to facilitate arcing performance of the high potential die which is DIE 2 in this example.

Figure 5:
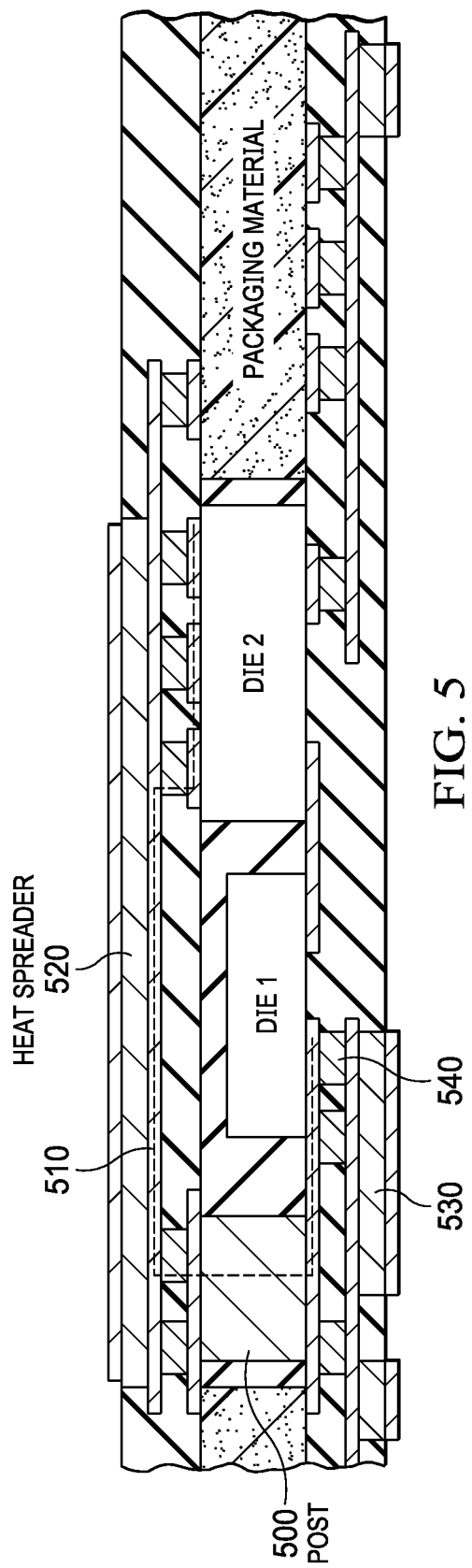
FIG. 5 illustrates an example of a vertical interconnection through an inserted post described herein.

FIG. 5 illustrates an example of signal and heat flow through a post 500 (made of, for example, copper, aluminum, silver gold, etc.) described herein. The post 500 has been inserted into the material. A dashed line 510 shows an example signal and/or heat path. A heat path is formed between a heat spreader 520 and another RDL layer 530 through VIA 540. In addition to conduction heat between multiple layers, the post 500 can also provide a signal path between multiple layers. For example, the post 500 can provide for signals to be transported from an RDL connected on one side of the respective die to another side to the respective die. In still yet another example. The post 500 can conduct both heat and electrical signals from one portion of the die to another portion of the same die and/or to other dies.

Figure 6:
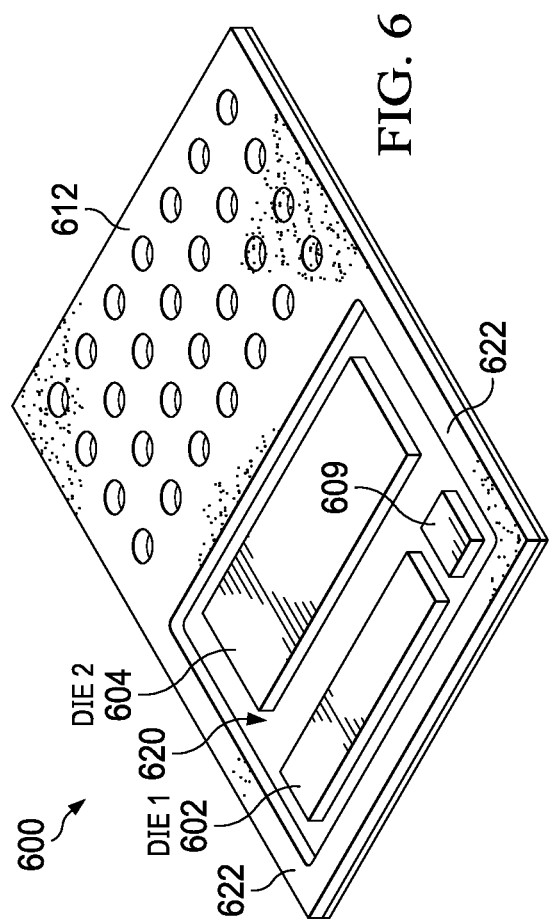
FIG. 6 illustrates a top-level view of an embedded die package where multiple die are inserted into the material.

FIG. 6 illustrates a top-level view of an embedded die package 600 where multiple dies are inserted into the material. The embedded die package 600 has an organic frame 612. The organic frame, in one example, is made of flame retardant material (FR4) in one example, or a composite material composed of woven fiberglass cloth with an epoxy resin binder that is flame resistant, where the woven fiberglass cloth can be pre-impregnated with the epoxy resin. The organic frame 612 can act as glue that holds the rest of the embedded die package together. As shown in FIG. 6, the embedded die package 600 includes an opening 620 into which a plurality of dies are inserted. In the example shown in FIG. 6, two die (Die 1 602 and Die 2 604) are inserted into the opening 620, however the embedded die package and opening 620 can have more than two dies. The die can be, for example, a driver integrated circuit or a power switching device, though other types of die structures and die materials are possible. Extra mechanical support can be provided by the organic frame 612 along the edges 622 of the organic frame. Edges of embedded dies are high stress points, so the organic frame can provide additional mechanical support on those edges.

Also shown in FIG. 6 is a post 609 (made of, for example, copper, aluminum, silver gold, etc.) that can be inserted through the opening 620 of the embedded die package and placed alongside the respective dies. The post 609 provides a connection between a first RDL coupled to one side of the respective dies and a second RDL coupled to another side of the respective dies. The post mitigates the use of an expensive and time-consuming plating process to connect RDL layers during manufacturing of the embedded die package. Plating adds stress to the packaging material, and using the post reduces the stress on the packaging material that the plating process would otherwise provide.

FIGS. 7-11 are described collectively to illustrate a fabrication process for the embedded die packages, dies, posts, and redistribution layers described herein. Before proceeding with the discussion of the fabrication processes depicted in FIGS. 7-11, a method is provided for constructing an embedded die package according to such processes where the method includes inserting a first die into an embedded die package as previously described. The first die has an operating voltage between a first voltage potential and a second voltage potential that is less than the first voltage potential, for example. The method includes fabricating a via, including a conductive material, to a bond pad on a surface of the first die, the via including at least one extension perpendicular to a plane along a length of the via. The method includes fabricating a redistribution layer (RDL) electrically connected to the via, at an angle with respect to the via defining a space between the surface and a surface of the RDL. The method includes filling the space with a build-up material.

Figure 7:
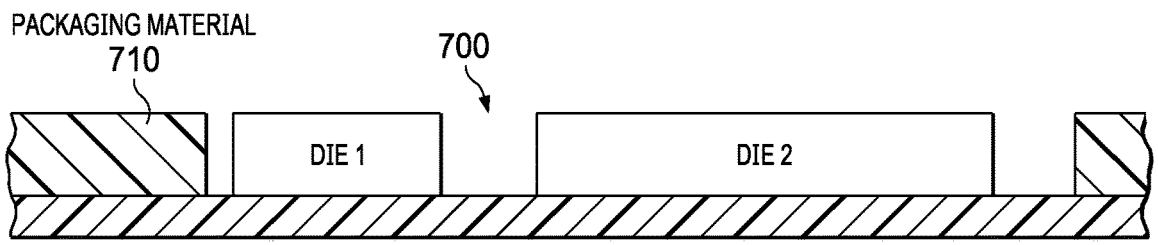
FIG. 7 illustrates the insertion of a plurality of dies through an opening of a embedded die package.
Figure 8:
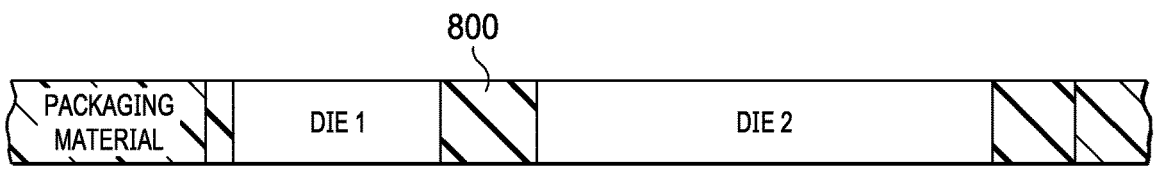
FIG. 8 illustrates the applying of a build-up material to fill gaps between a plurality of dies.
Figure 9:
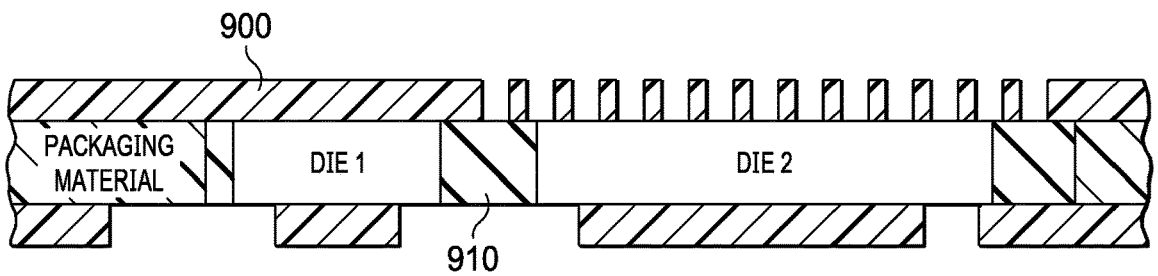
FIG. 9 illustrates a mask on a seed layer for interconnections between a plurality of dies.
Figure 10:
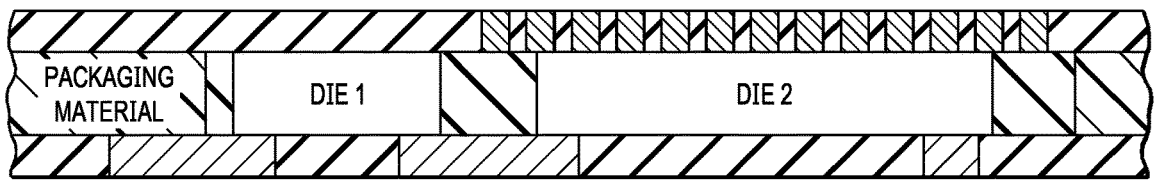
FIG. 10 illustrates applying metallic plating to voids of the mask to form a redistribution layer (RDL).
Figure 11:
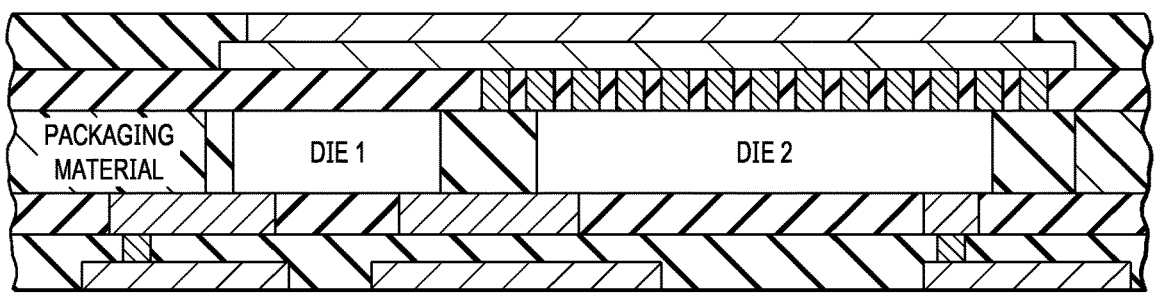
FIG. 11 illustrates stacking RDL layers as desired in order to provide more separation between dies and a redistribution layer (RDL).

FIG. 7 illustrates inserting a plurality of dies shown as DIEs 1 and 2 in this example through an opening 700 of an embedded die package 710. FIG. 8 illustrates applying a build-up material 800 to fill gaps between the plurality of dies. FIG. 9 illustrates applying a seed layer 900 on top of a build-up material 910, where the mask can be applied on top with openings to define interconnections between the plurality of dies. FIG. 10 illustrates forming at least one redistribution layer (RDL) within the mask to provide the interconnections between the plurality of dies. FIG. 11 illustrates stacking RDL layers as desired in order to provide more separation between dies and a redistribution layer (RDL) as previously described with respect to FIG. 3.

Although not shown, other fabrication processes can include fabricating at least one of the plurality of dies as a high voltage die having a higher substrate voltage potential than at least one other of the plurality of dies. This can include fabricating a passivation layer between at least one of the plurality of dies that provides a separation between the respective dies and at least one RDL. Other example processes can include fabricating at least a second RDL that is fabricated over the at least one RDL to provide a separation space between the high voltage die and the at least one RDL. At least one RDL can be fabricated as a vertical interconnect access (VIA) over the at least second RDL to provide a connection between the respective dies and the at least second RDL. Also, processes can be provided for fabricating a build-up material between the high voltage die and the at least one RDL. The build-up material has a dielectric property to sustain the high electric field between the high voltage die and the at least one RDL. Other fabrication examples include inserting a post through the opening of the embedded die package. The post can be employed to at least one of provide a connection between a first RDL coupled to one side of the respective dies and a second RDL coupled to another side of the respective dies or to conduct heat between the first and second RDL.

Figure 13:
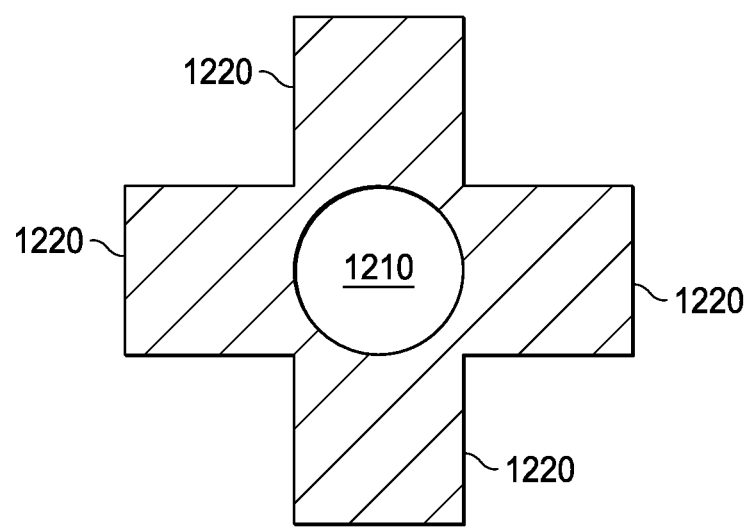
FIG. 13 illustrates a top view of an example VIA with four extensions.

FIG. 12 illustrates a top view of an example VIA 1200. The VIA 1200 includes an inner portion shown at 1210. Although shown as circular in shape, the VIA 1200 can be provided in other shapes such as square or rectangular shapes, for example. As mentioned previously, the VIA 1200 includes a conductive material and is electrically connected to a bond pad on a surface of a die (not shown). The via 1200 includes at least one extension 1220 from the edge of the inner portion 1210 and perpendicular to a plane along a length of the via. The extension 1220 can also be provided in other shapes than the circular example shown. For example, FIG. 13 illustrates a top view of an example VIA 1200. The VIA 1200 includes an inner portion shown at 1210. Although shown as circular in shape, the VIA 1200 can be provided in other shapes such as square or rectangular shapes, for example. The via 1200 includes at least four extensions 1220 from the edge of the inner portion 1210 and perpendicular to a plane along a length of the via.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An embedded die package, comprising:
   a first die having an operating voltage between a first voltage potential and a second voltage potential that is less than the first voltage potential;
   a via, including a conductive material, electrically connected to a bond pad on a surface of the first die, the via including at least one extension perpendicular to a plane along a length of the via;
   a redistribution layer (RDL) electrically connected to the via, at an angle with respect to the via defining a space between the surface and a surface of the RDL; and
   a build-up material in the space, wherein the via further includes at least four continuous extensions perpendicular to the plane along the length of the via.

2. The embedded die package of claim 1, wherein an end of the RDL is aligned with an end of the at least one extension.

3. The embedded die package of claim 1, wherein the build-up material in the space mitigates arcing between the first die and the RDL.

4. The embedded die package of claim 1, further comprising a second die having an operating voltage at a third voltage potential that is less than the second voltage potential, wherein the first voltage potential is about 600 volts and the second voltage potential is about 50 volts, and the third voltage potential is about 5 volts.

5. The embedded die package of claim 4, wherein the build-up material covers portions of the first die, the second die, the via, and the RDL.

6. The embedded die package of claim 1, wherein the length of the via is between about 20 and 100 micro meters.

7. The embedded die package of claim 6, wherein the space is about the length of the via.

8. The embedded die package of claim 1, wherein the conductive material is copper or gold.

9. The embedded die package of claim 1, wherein the build-up material is selected from a group consisting of: resin epoxy, silica build-up, and hardener.

10. The embedded die package of claim 1, wherein the embedded die package is a power switching device.

11. The embedded die package of claim 1, further comprising a post that is inserted through an opening of the embedded die package, the post employed to provide a connection between a first RDL coupled to one side of the first die and a second RDL coupled to another side of the first die.

12. An embedded die package, comprising:
   a die having an operating voltage between a first voltage potential and a second voltage potential that is less than the first voltage potential;
   a first via, including a conductive material, electrically connected to a bond pad on a surface of the die, the first via including at least one extension perpendicular to a plane along a length of the first via;
   a first redistribution layer (RDL) electrically connected to the via, at an angle with respect to the first via defining a first space between the surface and a surface of the first RDL;
   a second via, including a conductive material, electrically connected to the first RDL, the second via including at least one extension perpendicular to a plane along a length of the second via;
   a second redistribution layer (RDL) electrically connected to the second via, at an angle with respect to the second via defining a second space between the surface and the surface of the second RDL; and
   a build-up material to fill the first and second spaces defined by the first and the second vias, wherein the first via further includes at least four continuous extensions perpendicular to the plane along the length of the first via.

13. The embedded die package of claim 12, further comprising a post that is inserted through an opening of the semiconductor package, the post employed to provide a connection between the first RDL coupled to one side of the first die and the second RDL coupled to another side of the first die.

* * * * *